(12) United States Patent
Kim et al.

(10) Patent No.: US 7,449,417 B2
(45) Date of Patent: Nov. 11, 2008

(54) CLEANING SOLUTION FOR SILICON SURFACE AND METHODS OF FABRICATING SEMICONDUCTOR DEVICE USING THE SAME

(75) Inventors: Sang-Yong Kim, Yongin-si (KR); Chang-Ki Hong, Seongnam-si (KR); Woo-Gwan Shim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 11/489,494

(22) Filed: Jul. 20, 2006

(65) Prior Publication Data
US 2007/0163618 A1 Jul. 19, 2007

(30) Foreign Application Priority Data
Jan. 17, 2006 (KR) .................. 10-2006-0005116

(51) Int. Cl.
*H01L 21/461* (2006.01)
(52) U.S. Cl. ...................... 438/753; 438/756
(58) Field of Classification Search .......... 438/753, 438/756
See application file for complete search history.

(56) References Cited

U.S. PATENT DOCUMENTS

| | | | | |
|---|---|---|---|---|
| 5,472,512 A | * | 12/1995 | Gober et al. | 134/2 |
| 6,828,289 B2 | * | 12/2004 | Peters et al. | 510/175 |
| 2004/0115952 A1 | * | 6/2004 | Kim et al. | 438/754 |
| 2004/0244823 A1 | * | 12/2004 | Kim et al. | 134/28 |
| 2007/0277847 A1 | * | 12/2007 | Liu et al. | 134/2 |

FOREIGN PATENT DOCUMENTS

| | | |
|---|---|---|
| JP | 09-266194 | 10/1997 |
| KR | 10-2003-0066451 | 8/2003 |
| KR | 10-2004-0104835 | 12/2004 |

* cited by examiner

*Primary Examiner*—Trung Dang
(74) *Attorney, Agent, or Firm*—Harness, Dickey & Pierce, P.L.C.

(57) ABSTRACT

There are provided a cleaning solution for a silicon surface containing a buffer solution including acetic acid ($CH_3COOH$) and ammonium acetate ($CH_3COONH_4$), iodine oxidizer, hydrofluoric acid (HF), and water. In a method for fabricating a semiconductor device, a silicon substrate may have an exposed silicon surface, which may be cleaned using a cleaning solution that contains a buffer solution including acetic acid and ammonium acetate, iodine oxidizer, hydrofluoric acid, and water.

18 Claims, 5 Drawing Sheets

CLEANING SOLUTION FOR SILICON SURFACE AND METHODS OF FABRICATING SEMICONDUCTOR DEVICE USING THE SAME

PRIORITY STATEMENT

This application claims priority under 35 U.S.C. § 119 to Korean Patent Application No. 2006-0005116, filed on Jan. 17, 2006, in the Korean intellectual Property Office (KIPO), the entire contents of which are incorporated herein by reference.

BACKGROUND

1. Field

Example embodiments of the present invention relate to a cleaning solution, for example, a cleaning solution for cleaning a silicon surface; and methods for fabricating a semiconductor device using the same.

2. Description of the Related Art

A process of fabricating a semiconductor device may include an ion implantation process for forming an impurity diffusion layer, e.g., wells, and source/drain regions in a silicon substrate, a process of forming variously shaped structures by depositing or growing conductive or insulating thin films on the silicon substrate and patterning the conductive or insulating thin films, and a process of developing contacts to form circuits by electrically connecting stacked conductive structures to one another. The condition of the silicon surface exposed during each process may affect the quality of a thin film to be formed by subsequent processes. The exposed silicon surface may be deteriorated from contaminants or damages occurring during processes. That is, the exposed silicon surface may be damaged by various contaminants, for example, a native oxide layer, organic matters, metal impurities and particles and/or the like, during the preceding processes or while handling the silicon substrate between the processes. The exposed silicon surface may also be damaged during a dry etching process for patterning the thin films or during an ion implantation process for forming wells or sources/drains.

Thus, a cleaning process may be performed to remove a contamination source from the exposed silicon surface and a damaged portion of the silicon surface prior to each process. This cleaning process may need to be sufficiently performed prior to the processes sensitively affected by the condition of the silicon surface, for example, an epitaxial process, a salicide process and a self aligned contact (SAC) process and/or the like. In particular, the damaged portion of the exposed silicon surface may cause lattice defects on an epitaxial layer or a metal salicide layer and may increase surface roughness, and further it may increase leakage or resistance on contacts. Thus, the damaged portion may be sufficiently removed prior to each process.

In the conventional process of cleaning the silicon surface, standard clean 1 (SC1), which is a mixture of hydrogen peroxide ($H_2O_2$), ammonium hydroxide ($NH_4OH$) and deionized water (DI water), or a dilute fluoric acid solution and/or the like may be used according to needs. However, it may be difficult to use the SC1 and the dilute fluoric acid, for a long time, due to-the low etch selectivity of silicon to a silicon oxide layer, specifically, a BPSG layer used as an interlayer insulating layer in a process of fabricating a semiconductor device. Consequently, it may be difficult to expect a satisfactory cleaning effect.

SUMMARY

Example embodiments of the present invention may provide a cleaning solution for removing a damaged portion of an exposed silicon surface in fabricating a semiconductor device.

Example embodiments of the present invention may also provide a cleaning solution capable of improving the etch selectivity of silicon to a silicon oxide layer.

Example embodiments of the present invention may also provide a cleaning solution having a pH that is stable in a cleaning process.

Example embodiments of the present invention may also provide methods for fabricating a semiconductor device using such a cleaning solution.

According to an example embodiment of the present invention, there may be provided a cleaning solution for a silicon surface. The cleaning solution may contain a buffer solution including acetic acid ($CH_3COOH$) and ammonium acetate ($CH_3COONH_4$), iodine oxidizer, hydrofluoric acid (HF), and water and/or the like.

In example embodiments of the present invention, the iodine oxidizer may include iodine ($I_2$) and ammonium iodide ($NH_4I$) and/or the like.

In example embodiments of the present invention, the content of hydrofluoric acid may be about 0.01 to about 2 wt %, the content of acetic acid may be about 0.01 to about 30 wt %, the content of ammonium acetate may be about 0.01 to about 30 wt %, the content of iodine oxidizer may be about 0.01 to about 2 wt %, and the content of water may be about 90 wt % or less.

According to another example embodiment of the present invention, there may be provided methods for fabricating a semiconductor device using the cleaning solution. According to an example embodiment of the present invention, the methods for fabricating a semiconductor device may include preparing a silicon substrate having an exposed silicon surface. The exposed silicon surface may be cleaned using a cleaning solution containing a buffer solution including acetic acid and ammonium acetate, iodine oxidizer, hydrofluoric acid, and water and/or the like.

In some example embodiments, the iodine oxidizer may include iodine and ammonium iodide and/or the like.

In other example embodiments, the cleaning solution may contain hydrofluoric acid of about 0.01 to about 2 wt %, acetic acid of about 0.01 to about 30 wt %, ammonium acetate of about 0.01 to about 30 wt %, iodine oxidizer of about 0.01 to about 2 wt %, and water of about 90 wt % or less.

In other example embodiments, the cleaning solution may have a pH of about 3.9 to about 4.9.

In other example embodiments, cleaning the exposed silicon surface may be performed at a temperature of about 20° C. to about 50° C.

In other example embodiments, the exposed silicon surface may be a monocrystalline silicon surface or a polycrystalline silicon surface and/or the like.

In other example embodiments, a metal silicide layer or an epitaxial layer and/or the like may be formed on the exposed silicon surface, after cleaning the exposed silicon surface.

In other example embodiments, preparing the silicon substrate may include forming a gate pattern on the silicon substrate to selectively expose the surface of the silicon substrate. The gate pattern may be formed of polycrystalline silicon and/or the like.

According to example embodiments of the present invention, the method for fabricating a semiconductor device may include forming an insulating layer on a silicon substrate. An opening in the insulating layer may be formed. A surface of the silicon substrate having the opening may be cleaned using a cleaning solution containing a buffer solution including acetic acid and ammonium acetate, iodine oxidizer, hydrofluoric acid, and water and/or the like.

In some example embodiments, the insulating layer may be formed of a silicon oxide layer. The silicon oxide layer may be a BPSG layer and/or the like.

In other example embodiments, a gate pattern may be formed on the silicon substrate, before forming the insulating layer. The opening may expose the surface of the silicon substrate adjacent to the gate pattern.

The cleaning solution may be able to improve etch selectivity of silicon to a silicon oxide layer and to etch in a certain etch rate or more in order to selectively remove the exposed silicon surface. The cleaning solution may have a stable pH in order to reduce (if not prevent) a change in the etch rate or the etch selectivity in a cleaning process.

According to example embodiments of the present invention, the cleaning solution may contain iodine oxidizer and/or the like for oxidizing a silicon surface, hydrofluoric acid and/or the like may be provided as etchant for etching and removing the oxidized silicon surface, acetic acid and ammonium acetate and/or the like may be provided as a buffer solution for adjusting the pH of the cleaning solution and water.

Etching the silicon using the cleaning solution containing oxidizer and etchant may include forming chemical oxide on the silicon surface using the oxidizer and then etching the chemical oxide using the etchant. Accordingly, the etch selectivity of silicon to the silicon oxide layer may be determined by an oxidizing force of the oxidizer and each etch rate by the etchant. When etched together with the silicon oxide layer having a dense structure like a thermal oxide layer, the silicon may have higher etch selectivity to the silicon oxide layer because the chemical oxide has a weaker structure. However, when the silicon oxide layer has a weaker structure compared to the thermal oxide layer, for example, a BPSG layer and/or the like, the etch selectivity of the silicon to the silicon oxide layer may be reduced. For example, in the case of a cleaning solution containing nitric acid ($HNO_3$) and/or the like as an oxidizer and HF as an etchant, the etch selectivity of the silicon to the BPSG layer may have a very small value of about 0.5.

A scheme of adjusting pH of the cleaning solution may be considered in order to improve the etch selectivity of the silicon to the silicon oxide layer. In general, when the pH of the cleaning solution increases, the etch rate of the silicon and the silicon oxide layer decreases, in which there may be a difference in an etch rate reduction extent between the silicon and the silicon oxide layer. A conventional method for adjusting pH through a neutralization reaction, due to mixture of a basic solution, for example, ammonia and/or the like, or adding ammonium fluoride ($NH_4F$) and/or the like that is the conjugated base of hydrofluoric acid, may be used in order to adjust pH of the cleaning solution containing hydrofluoric acid. However, the use of the ammonia may cause carbon dioxide gas in the air to be dissolved in the cleaning solution, which continuously changes pH of the cleaning solution in the process. Further, a great amount of ammonium fluoride may be needed for the pH adjustment, and surface tension of the cleaning solution may significantly increase. Thus, it may be difficult to clean the silicon surface exposed by a fine pattern.

According to example embodiments of the present invention, the pH of the cleaning solution may be adjusted to a desired value by using the acetic acid and the ammonium acetate which is the conjugated base of the acetic acid, as the buffer solution. In this case, the cleaning solution, according to example embodiments of the present invention, may have a pH of about 3.9 to about 4.9. It may also be possible to prevent an unwanted change in pH of the cleaning solution in a cleaning process by using the acetic acid and the ammonium acetate and/or the like as the buffer solution.

In addition, according to example embodiments of the present invention, iodine oxidizer may be used. For example, the iodine oxidizer may include iodine and ammonium iodide and/or the like. The iodine and the ammonium iodide and/or the like may not change the pH of the cleaning solution that has been adjusted by the buffer solution and may have an oxidization force over a full range of pH of the cleaning solution. In this case, when only the iodine is used as the oxidizer, the solubility of the iodine to the water may be low. Thus, it may be difficult to be mixed in the cleaning solution. However, as in an example embodiment of the present invention, when the ammonium iodide is used together with the iodine as the oxidizer, $I_{3-}$ ions may be formed in water and the iodine may be easily dissolved.

According to example embodiments of the present invention, it may be possible to improve the etch selectivity of the silicon to the silicon oxide layer, especially, to a silicon oxide layer having a weaker structure, for example, a BPSG layer and/or the like, and to prevent a unwanted change in pH in processes by stably adjusting the pH of the cleaning solution using the acetic acid and the ammonium acetate and/or the like as the buffer solution. It may also be possible to improve the etch rate by adjusting the amount of iodine oxidizer and hydrofluoric acid mixed as etchant in the cleaning solution.

BRIEF DESCRIPTION OF THE DRAWINGS

The present invention will become more apparent by describing in detail the example embodiments shown in the attached drawings in which.

DETAILED DESCRIPTION OF THE EXAMPLE EMBODIMENTS OF THE PRESENT INVENTION

Figure 1:
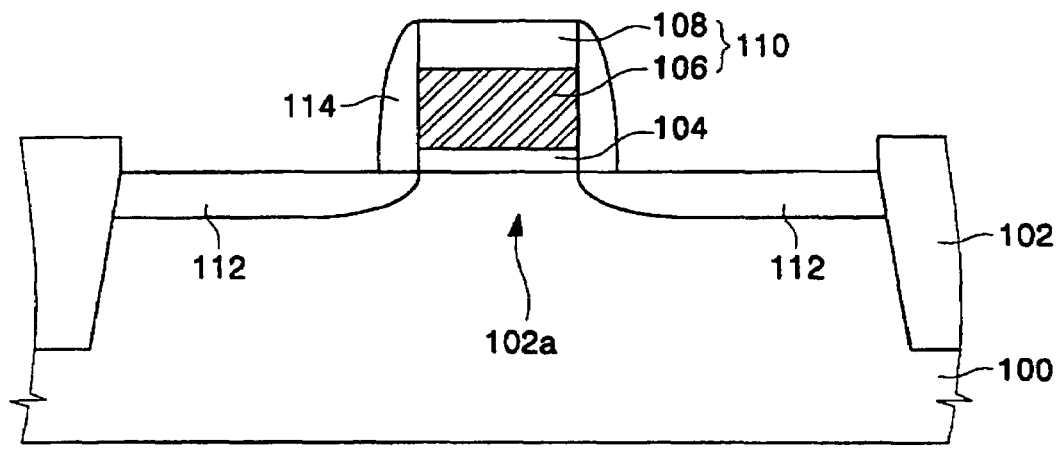
FIGS. 1 through 3 illustrate a method for fabricating a semiconductor device according to example embodiments of the present invention.

Various example embodiments of the present invention will now be described more fully with reference to the accompanying drawings, in which some example embodiments of the invention are shown. This invention may, however, be embodied in many alternate forms and should not be construed as limited to only the embodiments set forth herein. Rather, these embodiments are provided so that this disclosure will be thorough and complete, and will fully convey the scope of the invention to those skilled in the art. Like numbers refer to like elements throughout the specification.

It will be understood that, although the terms first, second, etc. may be used herein to describe various elements, these elements should not be limited by these terms. It will be understood that, although the terms first, second, etc. may be used herein to describe various elements, these elements should not be limited by these terms.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 2:
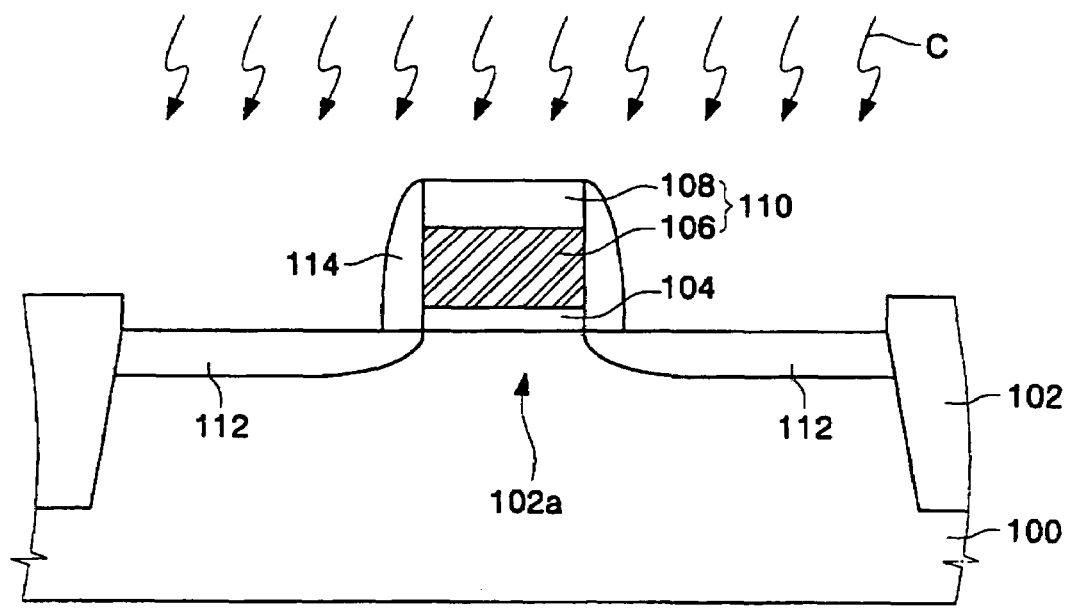
Figure 3:
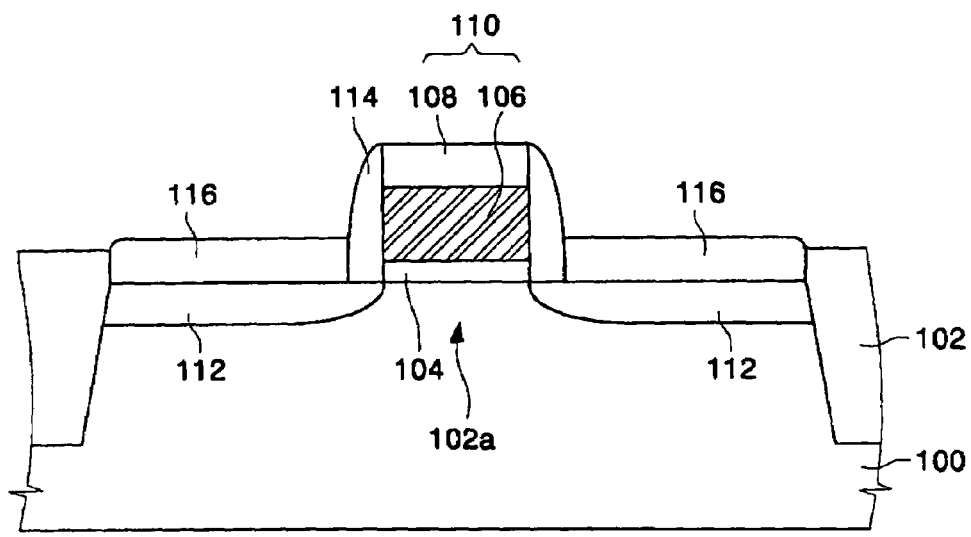

FIGS. 1 through 3 illustrate a method for fabricating a semiconductor device according to example embodiments of the present invention.

Referring to FIG. 1, a silicon substrate 100 may be prepared. A device isolation layer 102 may be formed to define an active region 102a in the silicon substrate 100. The device isolation layer 102 may be formed of a silicon oxide layer, for example, a high-density plasma (HDP) oxide layer and/or the like, using a shallow trench isolation (STI) process. A gate insulating layer may be formed on the active region 102a. The gate insulating layer may be formed of a thermal oxide layer and/or the like. Thereafter, a gate conductive layer and a capping layer may be sequentially formed on the gate insulating layer. The gate conductive layer may be formed of a polycrystalline silicon layer and/or the like, and the capping layer may be formed of a silicon nitride layer or a silicon oxide layer and/or the like. The gate conductive layer and the capping layer may be sequentially patterned to form a gate pattern 110 which traverses the active region 102a. As a result, the gate pattern 110 may include a gate electrode 106 and a capping layer pattern 108 that may be sequentially stacked. The process of forming the capping layer may be omitted. In this case, the gate pattern 110 may be formed of only the gate electrode 106. The gate insulating layer may be also patterned in the process of forming the gate pattern 110, such that a gate insulating layer pattern 104 may be formed between the gate pattern 110 and the active region 102a, as shown in FIG. 1.

Impurities may be implanted into the active region 102a using the gate pattern 110 and the device isolation layer as ion implantation masks to form source/drain regions 112. The impurities may be N or P type impurities and/or the like. After the source/drain regions 112 are formed, a gate spacer 114 may be formed to cover sidewalls of the gate pattern 110. The gate spacer 114 may be formed by forming a spacer layer, for example, a silicon nitride layer and/or the like, on the silicon substrate 100 having the source/drain regions 112 and anisotropically etching the spacer layer.

Referring to FIG. 2, in the anisotropic etching process for patterning the gate pattern 110 and the ion implantation process for forming the source/drain regions 112, the exposed silicon surface of silicon substrate 100, e.g., the surface of the active region 102a exposed by the gate pattern 110, may be damaged. Because the damaged portion of the exposed silicon surface may negatively affect the property of thin films formed during a subsequent process, the damaged portion may need to be removed through a cleaning process C using a proper cleaning solution. According to example embodiments of the present invention, the cleaning process C may be performed by using the cleaning solution containing a buffer solution including acetic acid and ammonium acetate, iodine oxidizer, hydrofluoric acid, and water and/or the like as described above. The iodine oxidizer may include iodine and ammonium iodide and/or the like. The cleaning solution may contain hydrofluoric acid of about 0.01 to about 2 wt %, acetic acid of about 0.01 to about 30 wt %, ammonium acetate of about 0.01 to about 30 wt %, iodine and ammonium iodide of about 0.01 to about 2 wt %, and water of about 90 wt % or less. Further, the cleaning process C may be performed at a temperature of about 20° C. to about 50° C.

The exposed silicon surface, e.g., the damaged portion of the active region 102a exposed by the gate pattern 110, may be effectively removed through the cleaning process C without affecting other layers, for example, the device isolation layer formed of a silicon oxide layer, and/or the gate insulating layer. In addition, contaminants, for example, a native oxide layer formed on the active region 102a, may be removed through the cleaning process C.

Meanwhile, if the gate pattern 110 is formed of only the gate electrode 106 and the gate electrode 106 is formed of polycrystalline silicon as described above, the damaged portion of the gate electrode 106 surface may be also removed in the cleaning process C.

Referring to FIG. 3, after the cleaning process C is performed, epitaxial layers 116 may be grown on the source/drain regions 112. The epitaxial layers 116 may be formed through a well known selective epitaxial growth process. Meanwhile, if the gate pattern 110 is formed of only the gate electrode 106 and the gate electrode 106 is formed of polycrystalline silicon as described above, another epitaxial layer having a different crystalline structure from the epitaxial layers 116 may be formed on the gate electrode 106. That is, when the epitaxial layers 116 have a monocrystalline structure, for example, the silicon substrate 100, another epitaxial layer formed on the gate electrode 106 may have a polycrystalline structure, for example, the gate electrode 106 formed of polycrystalline silicon. The epitaxial layers 116 may be formed on the source/drain regions 112 or on the source/drain regions 112 and the gate electrode 106 after the cleaning process C is performed. Thus, surface roughness or internal defects caused by the condition of the exposed silicon surface of the silicon substrate 100 may be reduced (if not minimized).

Figure 4:
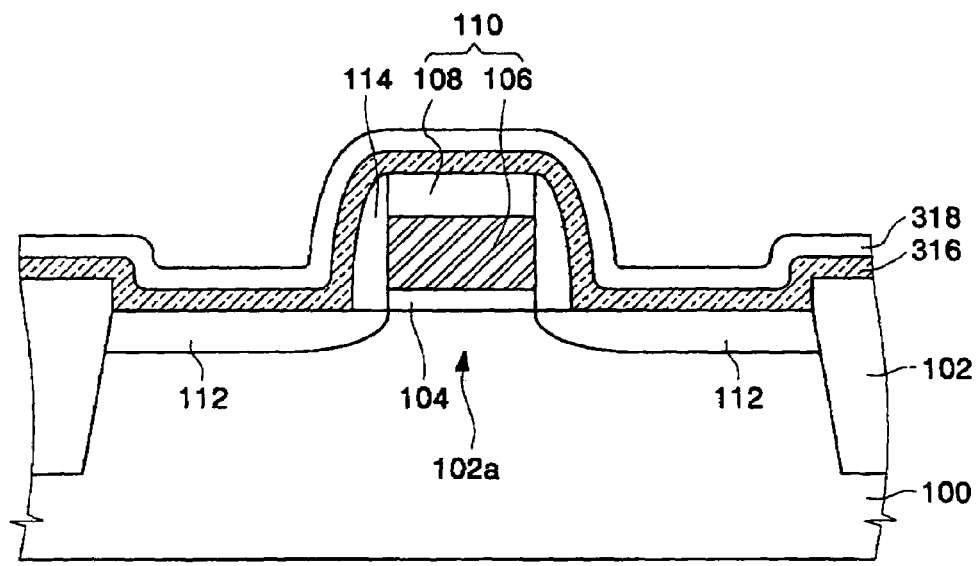
FIGS. 4 and 5 illustrate a method for fabricating a semiconductor device according to other example embodiments of the present invention.
Figure 5:
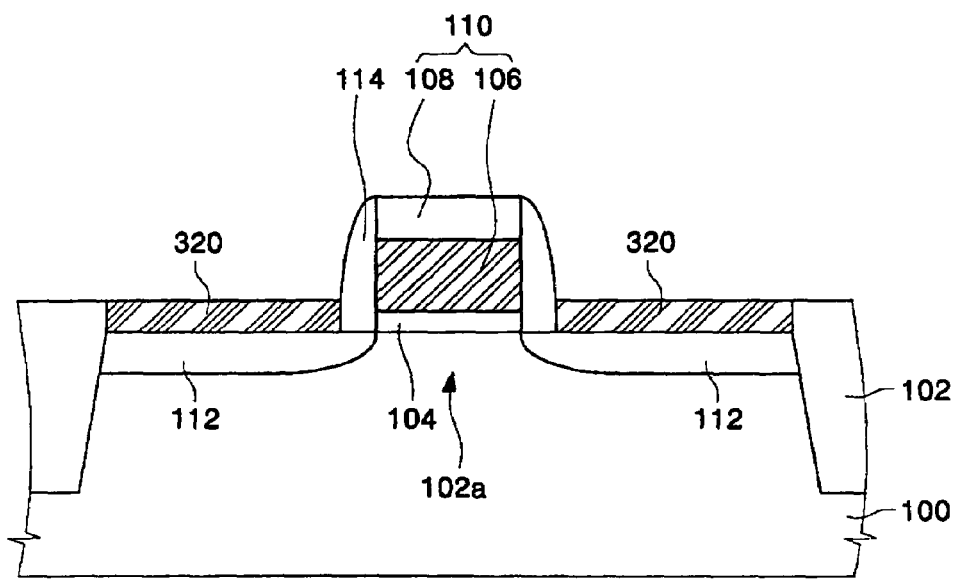

FIGS. 4 and 5 illustrate a method for fabricating a semiconductor device according to example embodiments of the present invention.

Referring to FIGS. 1, 2, and 4, after the gate pattern 110 and the source/drain regions 112 are formed on the silicon substrate 100, the cleaning process C may be performed on the exposed silicon surface of the silicon substrate 100, e.g., the surface of the active region 102a, which may be exposed by the gate pattern 110 using the cleaning solution described above, as illustrated in FIGS. 1 and 2. After the damaged portion of the exposed silicon surface is removed through the cleaning process C, a metal layer 316 and a silicide capping layer 318 may be sequentially formed on the silicon substrate 100. The metal layer 316 may be formed of for example a nickel layer, a cobalt layer, or a titanium layer and/or the like. Further, silicide capping layer 318 may be formed of a titanium nitride layer and/or the like.

Referring to FIG. 5, silicide annealing may be performed on the silicon substrate 100 having the metal layer 316, and the silicide capping layer 318, to form metal silicide layers 320 on source/drain regions 112. The metal silicide layers 320 may be nickel silicide layers, cobalt silicide layers, or titanium silicide layers and/or the like. The silicide capping layer 318 and unreacted portion of the metal layer 316 may then be removed. Meanwhile, if the gate pattern 110 is formed of only the gate electrode 106 and the gate electrode 106 is formed of polycrystalline silicon as described above, the metal silicide layer may be formed even on the gate electrode 106.

The metal silicide layers 320 may be formed on the source/drain regions 112 or on the source/drain regions 112 and the gate electrode 106 after the cleaning process C is performed. Thus, surface roughness or internal defects caused by the condition of the exposed silicon surface of the silicon substrate 100 may be reduced (if not minimized).

Figure 6:
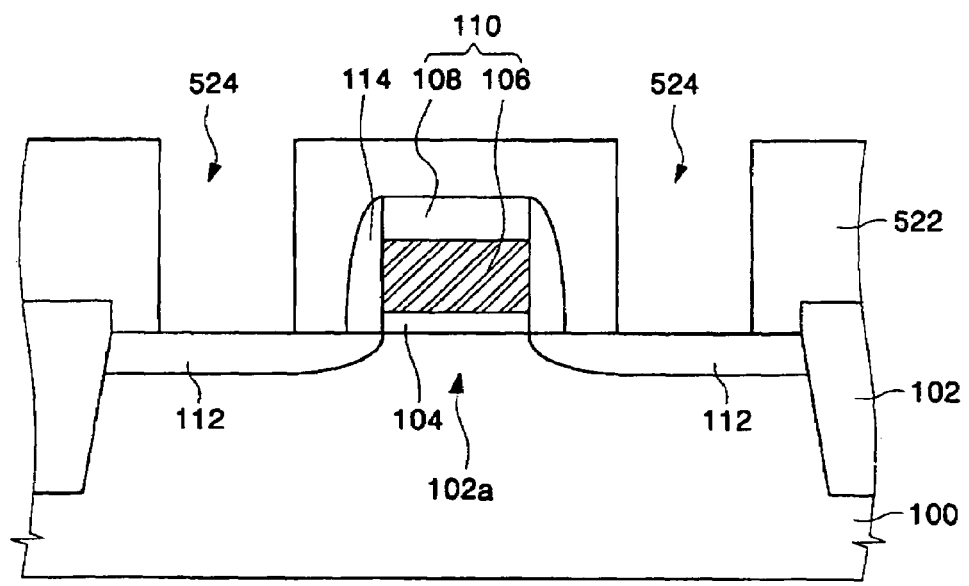
FIGS. 6 through 8 illustrate a method for fabricating a semiconductor device according to other example embodiments of the present invention.
Figure 7:
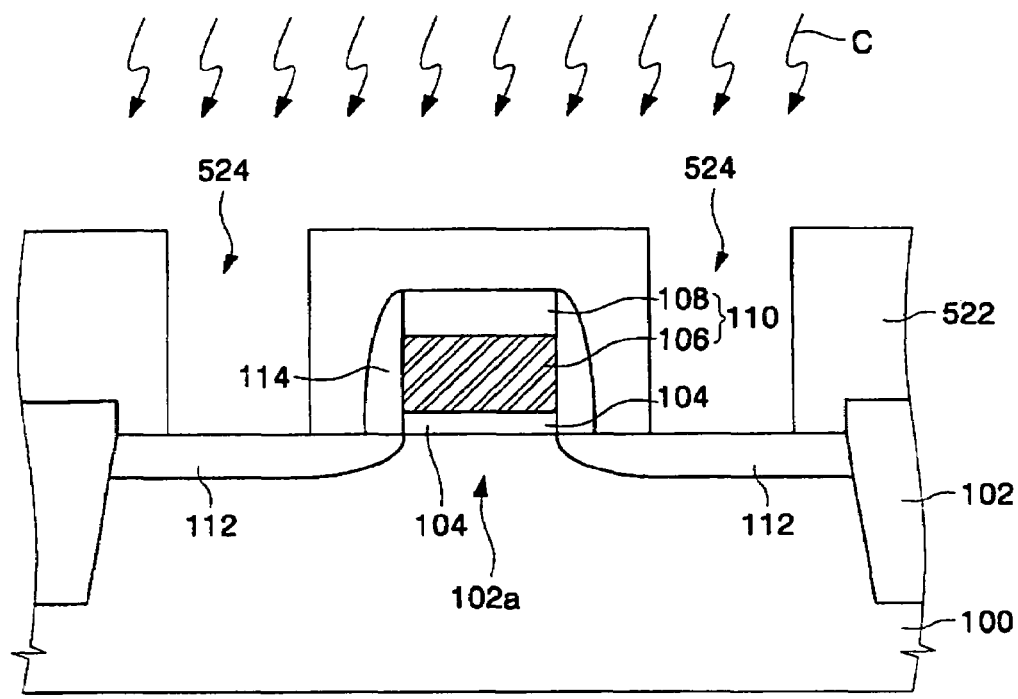
Figure 8:
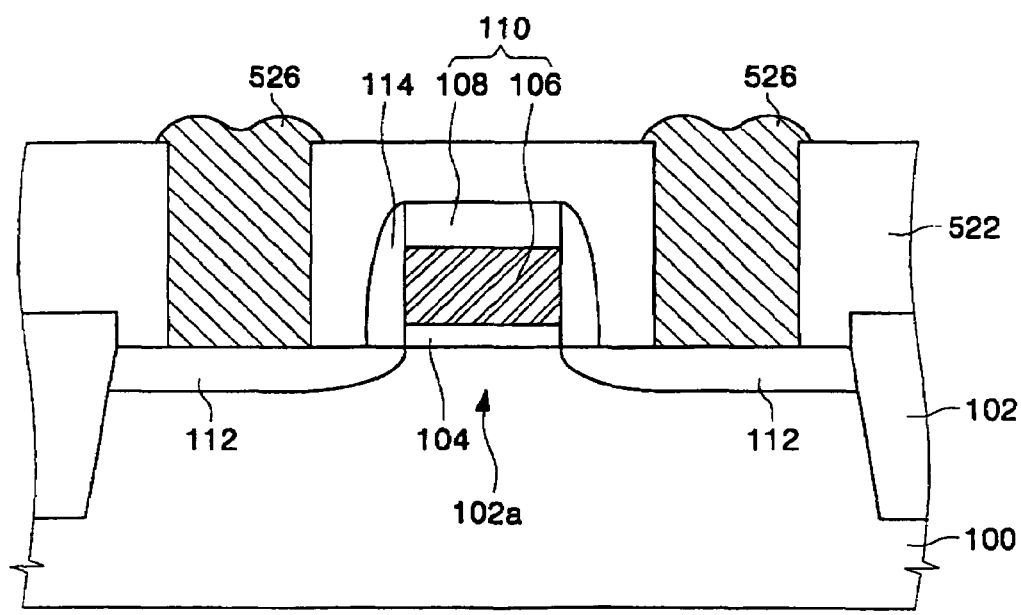

FIGS. 6 through 8 illustrate a method for fabricating a semiconductor device according to example embodiments of the present invention.

Referring to FIGS. 1 and 6, a gate pattern 110 and source/drain regions 112 may be formed on the silicon substrate 100, as illustrated in FIG. 1. An insulating layer 522 may be formed on the silicon substrate 100 having the gate pattern 110. The insulating layer 522 may be formed of a BPSG layer. The insulating layer 522 may be patterned to form openings 524 which expose the surface of the silicon substrate 100 adjacent to the gate pattern 110, e.g., the surfaces of the source/drain regions 112.

Referring to FIG. 7, the surface of the silicon substrate 100 exposed by the openings 524 may be damaged in the anisotropic etching process for patterning the insulating layer 522. Accordingly, the surface of the silicon substrate 100 exposed by the openings 524 may be cleaned through the cleaning process C as illustrated in FIG. 2, thereby removing the damaged portion. The cleaning process C may be performed by using the cleaning solution containing a buffer solution including acetic acid and ammonium acetate, iodine oxidizer, hydrofluoric acid, and water and/or the like, as described above. Thus, it may be possible to selectively etch the surface of the silicon substrate 100 exposed by the openings 524 while suppressing the etching of the insulating layer 522 even when the insulating layer 522 may be formed of a silicon oxide layer having a weaker structure, for example, the BPSG layer.

Referring to FIG. 8, after the cleaning process C is performed, a conductive layer may be formed on an entire surface of the silicon substrate 100 having the openings 524, and the conductive layer may be patterned to form contact plugs 526 with which the openings 524 may be filled.

Figure 9:
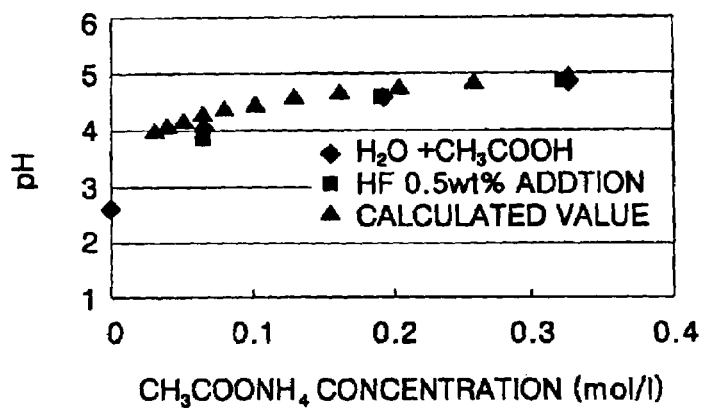
FIG. 9 is a graph illustrating a pH change with respect to an added amount of ammonium acetate in a cleaning solution containing acetic acid and the ammonium acetate as a buffer solution.

In FIGS. 6 through 8, the openings 524 (not shown) may be formed to expose a polycrystalline silicon surface on the silicon substrate 100. For example, the openings 524 (not shown) may be formed to expose the top surface of the gate electrode 106 formed of polycrystalline silicon. FIG. 9 is a graph illustrating a pH change with respect to an added amount of ammonium acetate in a cleaning solution containing acetic acid and the ammonium acetate as a buffer solution. The results of FIG. 9 were obtained by adding ammonium acetate to an acetic acid solution that is diluted about 100:1 and then measuring a change in pH with respect to the added amount of the ammonium acetate. In FIG. 9, data denoted by symbol "□" indicates pH measured with respect to the added amount of the ammonium acetate in the acetic acid solution that is diluted 100:1, and data denoted by a symbol "■" indicates pH measured after hydrofluoric acid of about 0.5 wt % is added to the cleaning solution having a pH that is adjusted using the acetic acid and the ammonium acetate. Further, data denoted by symbol "▲" indicates pH calculated with the added amount of the ammonium acetate in the acetic acid solution that is diluted about 100:1.

FIG. 9 shows that when the acetic acid and the ammonium acetate are used as the buffer solution, the calculated pH was similar with the measured pH. Further, the pH measured with added hydrofluoric acid of about 0.5 wt % was substantially the same as that when the hydrofluoric acid is not added. This shows that when the acetic acid and the ammonium acetate are used as the buffer solution, the pH of the cleaning solution may be stably adjusted. It also shows that because the addition of the hydrofluoric acid does not change the pH of the cleaning solution, the silicon etch rate may be adjusted by the amount of hydrofluoric acid added without changing the pH of the cleaning solution if acetic acid and ammonium acetate may be used as the buffer solution.

Figure 10:
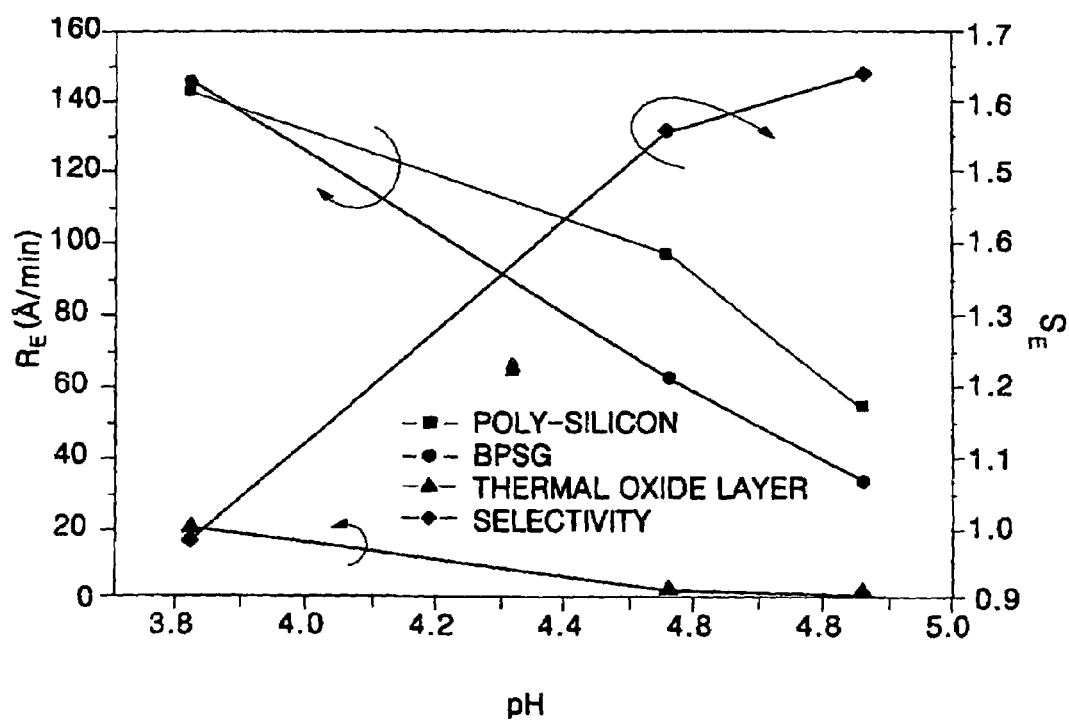
FIG. 10 is a graph illustrating an etch property with respect to a change in pH of a cleaning solution according to an example embodiment of the present invention.

FIG. 10 is a graph illustrating an etch property with respect to a change in pH of a cleaning solution according to an example embodiment of the present invention. The cleaning solution according to an example embodiment of the present invention may be prepared by mixing hydrofluoric acid, acetic acid and ammonium acetate, iodine, ammonium iodide, and water and/or the like with a proper composition ratio in a range according to example embodiments of the present invention, as described above. The pH of the cleaning solution may be adjusted through a composition ratio of the acetic acid and the ammonium acetate. A polycrystalline silicon layer, a BPSG layer, and a thermal oxide layer may then be formed on the silicon substrates, respectively, and the layers may be etched by using the prepared cleaning solution. In FIG. 10, data denoted by symbol "-■-" indicates the etch rate of the polycrystalline silicon layer RE, data denoted by symbol "-●-" indicates the etch rate RE of the BPSG layer, and data denoted by symbol "-▲-" indicates the etch rate RE of the thermal oxide layer. Further, data denoted by symbol "-□-" indicates the etch selectivity SE of the polycrystalline silicon layer to the BPSG layer.

Referring to FIG. 10, the etch rates of the polycrystalline silicon layer, the BPSG layer and the thermal oxide layer may decrease as pH of the cleaning solution increases. It may be that the thermal oxide layer having the densest structure has the lowest etch rate, and the least etch rate reduction with the increased pH of the cleaning solution. On the other hand, the etch rate of the polycrystalline silicon layer and the etch rate of the BPSG layer may be similar at about 140□/min when pH of the cleaning solution is about 3.8, and increasingly decrease the pH of the cleaning solution. In this case, as the pH of the cleaning solution increases, the etch rate of the BPSG layer may significantly decrease compared to the etch rate of the polycrystalline silicon layer. As a result, as pH of the cleaning solution may increase from about 3.8 to about 4.8 and about 4.9, the etch selectivity of the polycrystalline silicon layer to the BPSG layer may increase from about 1.0 or less to about 1.57 and about 1.65.

These results show that when the silicon layer and the silicon oxide layer are cleaned together using the cleaning solution according to example embodiments of the present invention, the loss of the silicon oxide layer may be reduced (if not minimized) and the silicon layer may be selectively etched even when the silicon oxide layer has a relatively weaker structure, for example, the BPSG layer.

As described above, according to an example embodiment of the present invention, the damaged portion of the exposed silicon surface may be removed in fabricating a semiconductor device using the cleaning solution having stably adjusted pH. Further, the etch selectivity of the silicon to the silicon oxide layer may be improved. Thus, it may be possible to reduce (if not minimize) loss even when the silicon oxide layer has a relatively weak structure and to selectively etch the silicon.

While example embodiments of the present invention have been particularly shown and described with reference to the example embodiments shown in the drawings, it will be understood by those of ordinary skill in the art that various changes in form and details may be made therein without departing from the spirit and scope of the present invention as defined by the following claims.

What is claimed is:

1. A cleaning solution for a silicon surface comprising:
   a buffer solution including acetic acid and ammonium acetate, iodine oxidizer, hydrofluoric acid and water,
   wherein the content of hydrofluoric acid is about 0.01 to 2 wt %, inclusive, the content of acetic acid is about 0.01 to 30 wt %, inclusive, the content of ammonium acetate is about 0.01 to 30 wt %, inclusive, the content of iodine oxidizer is about 0.01 to 2 wt %, inclusive, and the content of water is about 90 wt % or less.

2. The cleaning solution according to claim 1, wherein the iodine oxidizer includes iodine, ammonium iodide and a mixture thereof.

3. The cleaning solution according to claim 1, wherein the pH is about 3.9 to about 4.9.

4. A method for fabricating a semiconductor device, the method comprising:
   preparing a silicon substrate having an exposed silicon surface; and
   cleaning the exposed silicon surface using the cleaning solution according to claim 1.

5. The method according to claim 4, wherein the iodine oxidizer includes iodine, ammonium iodide and a mixture thereof.

6. The method according to claim 4, wherein the cleaning solution has a pH of about 3.9 to about 4.9.

7. The method according to claim 4, wherein cleaning the exposed silicon surface is performed at a temperature of about 20° C. to about 50° C.

8. The method according to claim 4, wherein the exposed silicon surface is a monocrystalline silicon surface or a polycrystalline silicon surface.

9. The method according to claim 4, further comprising:
   forming a metal layer and a silicide capping layer sequentially on the silicon substrate.

10. The method according to claim 4, further comprising:
    performing silicide annealing on the silicon substrate having a metal layer and a silicide capping layer to form metal silicide layers.

11. The method according to claim 4, further comprising:
    forming a metal silicide layer or an epitaxial layer on the exposed silicon surface, after cleaning the exposed silicon surface.

12. The method according to claim 11, wherein the metal silicide layer is one of a group including nickel silicide layers, cobalt silicide layers, or titanium silicide layers.

13. The method according to claim 4, wherein preparing the silicon substrate includes forming a gate pattern on the silicon substrate to selectively expose the surface of the silicon substrate.

14. The method according to claim 13, wherein the gate pattern is formed of polycrystalline silicon.

15. The method of claim 4, further comprising:
    forming an insulating layer on a silicon substrate,
    forming an opening in the insulating layer, and
    cleaning the exposed silicon surface using the cleaning solution.

16. The method according to claim 15, wherein the insulating layer is formed of a silicon oxide layer.

17. The method according to claim 16, wherein the silicon oxide layer is a BPSG layer.

18. The method according to claim 15, further comprising:
    forming a gate pattern on the silicon substrate, before forming the insulating layer, the opening exposing a surface of the silicon substrate adjacent to the gate pattern.

* * * * *